(12) United States Patent
Shibasaki

(10) Patent No.: US 6,379,098 B1
(45) Date of Patent: Apr. 30, 2002

(54) CHIP FEEDER FOR CHIP MOUNTER

(75) Inventor: Masanori Shibasaki, Nagano (JP)

(73) Assignee: Japan Servo Co. Ltd., Tokyo-to (JP)

( * ) Notice: Subject to any disclaimer, the term of this patent is extended or adjusted under 35 U.S.C. 154(b) by 0 days.

(21) Appl. No.: 09/553,379

(22) Filed: Apr. 20, 2000

(30) Foreign Application Priority Data

| Apr. 22, 1999 | (JP) | ............................................ 11-115117 |
| Apr. 22, 1999 | (JP) | ............................................ 11-115119 |
| May 27, 1999 | (JP) | ............................................ 11-147533 |
| Apr. 18, 2000 | (JP) | ...................................... 2000-117103 |

(51) Int. Cl.⁷ ............................................ B65B 21/02
(52) U.S. Cl. .......................... 414/416; 221/25; 221/73; 156/584
(58) Field of Search ................................ 156/344, 584; 221/25, 72, 73, 79, 87; 226/8, 120, 139; 414/411, 416, 425

(56) References Cited

U.S. PATENT DOCUMENTS

| 4,768,915 A | 9/1988 | Fujioka |
| 4,952,113 A | 8/1990 | Fujioka |
| 5,310,301 A | 5/1994 | Aono |
| 5,992,791 A | * 11/1999 | Tsuda et al. ............. 242/535.3 |
| 6,260,260 B1 | * 7/2001 | Suhara ......................... 29/740 |
| 6,261,047 B1 | * 7/2001 | Kubota ........................ 414/411 |
| 6,269,860 B1 | * 8/2001 | Ishakawa et al. ........... 156/584 |
| 2001/0017189 A1 | * 8/2001 | Tsujimoto et al. .......... 156/344 |

FOREIGN PATENT DOCUMENTS

JP   3-212312   * 3/1991   ........... B65B/15/04

* cited by examiner

Primary Examiner—David H. Bollinger
Assistant Examiner—Kenneth W Bower
(74) Attorney, Agent, or Firm—Oblon, Spivak, McClelland, Maier & Neustadt, P.C.

(57) ABSTRACT

The chip feeder for the chip mounter includes a tape feeding mechanism for feeding a carrier tape that includes a rotating connection member for connecting the carrier tape, a first motor for driving the rotating connection member and a first transmission mechanism for transmitting drive power to the rotating connection member, and a cover peeling mechanism for peeling a top cover tape from the carrier tape that includes a peeling reel for winding the top cover tape, a second motor for driving the peeling reel and a second transmission mechanism for transmitting drive power to the peeling reel. The first and second motors are outer rotor motors each of which includes a cylindrical stator fixed to a base having exciter coils and pole pieces, and a cylindrical rotor arranged around the stator with a gap. The first and second transmission mechanisms are engaged with outer surfaces of the rotors.

21 Claims, 17 Drawing Sheets

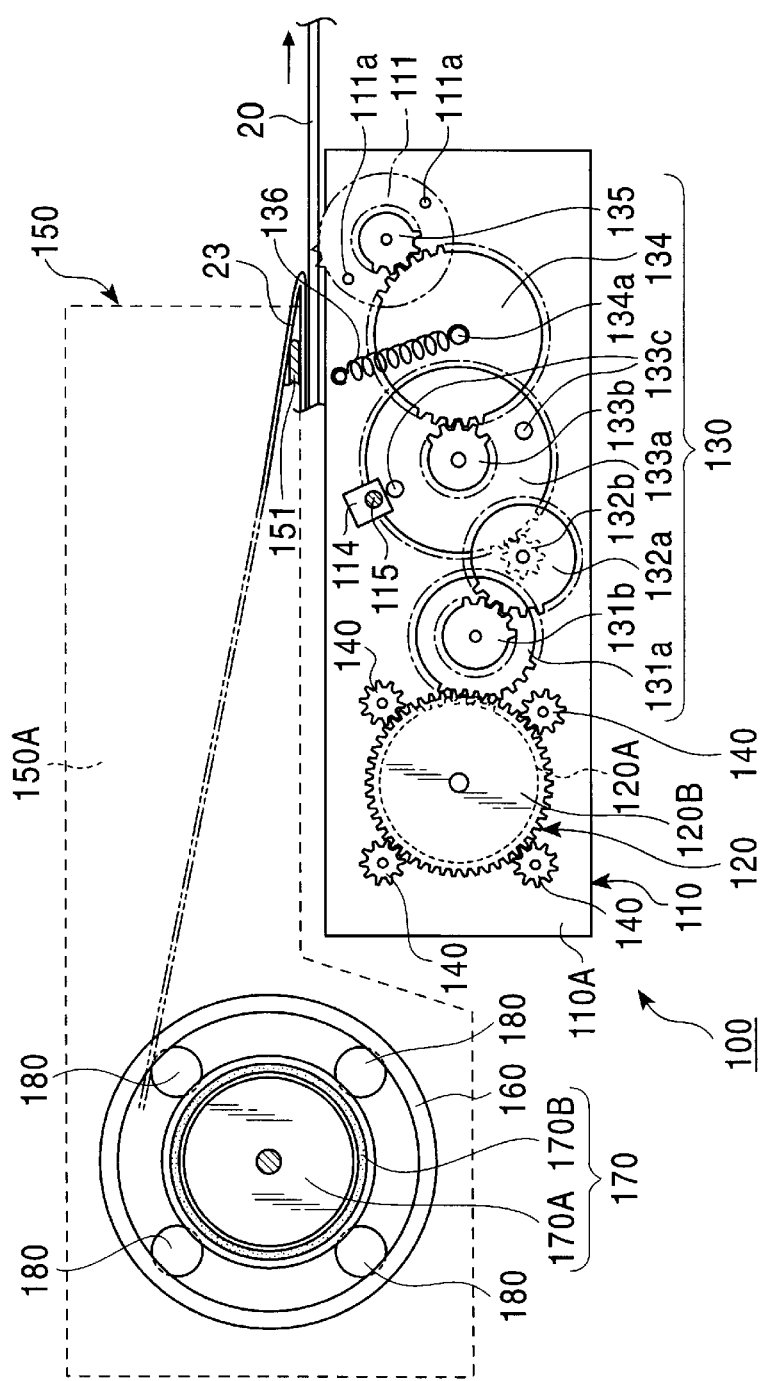
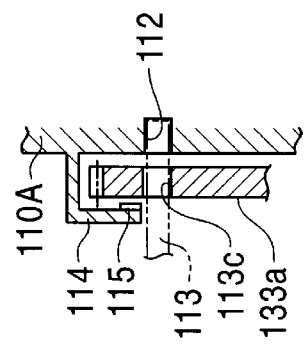
FIG. 1A
FIG. 1B

CHIP FEEDER FOR CHIP MOUNTER

BACKGROUND OF THE INVENTION

The present invention relates to a chip feeder for conveying a carrier tape, in which electronic chips such as chip resisters, chip capacitors or IC chips are sealed, to supply the chips to a chip mounter.

FIG. 16 shows a chip mounter 1 that automatically mounts the electronic chips on an electronic circuit board 2. The chip mounter 1 is provided with a first X-table 3 that carries the electronic circuit board 2, a second X-table 4 on which a plurality of chip feeders 10 are mounted and a placement head 6 that is supported by an arm 5 upon the X-tables 2 and 3. The first and second X-tables 2 and 3 are movable in an X-direction in a horizontal plane. The placement head 6 moves along a Y-direction that is perpendicular to the X-direction in the horizontal plane and along a Z-direction that is a vertical direction.

The placement head 6 chucks the electronic chip selected from the chips supplied by the chip feeders 10 and places the chucked chip on a predetermined position of the electronic circuit board 2.

The chip feeder 10 supplies the electronic chips sealed in a carrier tape such that the placement head 6 is able to pick the chips. As shown in FIGS. 17A and 17B, a series of emboss portions 21 are formed on the carrier tape 20 along its length, and a series of sprocket holes 22 are formed next to the emboss portions 21. The emboss portion 21 is a closed-end hollow and the sprocket hole 22 is a through hole. Top openings of the emboss portions 22 are sealed by a top cover tape 23 to prevent drop out of the electronic chips 7. The carrier tape 20, which includes the electronic chips 7 and is sealed by the top cover tape 23, is provided to a user as a warped condition around a reel.

Each of the chip feeders 10 is provided with a tape feeding mechanism 10A and a cover peeling mechanism 10B as shown in FIG. 18. The tape feeding mechanism 10A is provided with a sprocket 11 that connects the sprocket holes 22 formed on the carrier tape 20. A worm wheel 12 is coaxially fixed to the sprocket 11. A DC motor 13 rotates a worm 14 that is connected by a coupling 13a, and then the worm 14 rotates the worm wheel 12 with the sprocket 11. In general, the sprocket 11 includes a ratchet mechanism to keep constant feeding pitch. The cover peeling mechanism 10B includes a peeling reel 15 to wind the top cover tape 23 and a DC motor 16 to drive the peeling reel 15. An output axis of the DC motor 16 is connected to a worm 17 through a coupling 16a, and a worm wheel 18a is connected with the worm 17. A gear 18b that is coaxially fixed to the worm wheel 18a meshes with an external gear around the peeling reel 15.

When the DC motor 13 of the tape feeding mechanism 10A is driven, the sprocket 11 rotates in the clockwise direction in FIG. 18, which transfers the carrier tape 20 in the rightward direction in the drawing. On the other hand, a peeling piece 19 is fixed to a base 10C of the chip feeder at the upstream from the sprocket 11 along the transmission of the carrier tape 20. The top cover tape 23 is folded back by the peeling piece 19 to be wound by the peeling reel 15. Therefore, when the DC motor 16 of the cover peeling mechanism 10B is driven, the peeling reel 15 rotates in the counterclockwise direction in FIG. 18 to wind the top cover tape 23 that is peeled from the carrier tape 20. The DC motors 13 and 16 are controlled to synchronize the feeding of the carrier tape 20 and the peeling of the top cover tape 23.

Since the number of the chip feeders 10 mounted on the chip mounter 1 corresponds the chip variations contained on the electronic circuit board 2, the number of the chip feeders 10 increases as the electronic circuit becomes complex. On the other hand, the width of the carrier tape 20 is determined by the packaged chip size. Thus, the width of the chip feeder 10 should not be too large with respect to the width of the carrier tape 20 in order to mount a large number of the chip feeders 10 in the limited mount space. For instance, the chip mounter, in which forty chip feeders are aligned, requires the width equal to or smaller than fifteen millimeters for the individual chip feeder.

However, the conventional chip feeder 10 is difficult to reduce the width because of the spindle type DC motors 13 and 16. Necessary rotation torque for the feeding and the peeling limits miniaturization of the DC motors. When the DC motor is arranged such that the spindle is perpendicular to the width direction as shown in FIG. 18, the diameter of the DC motor determines the width of the chip feeder, which avoids decreasing the width of the chip feeder. On the other hand, when the spindle is parallel to the width direction, the width is determined by the length of the motor body and the projected spindle, which also avoids decreasing the width of the chip feeder.

SUMMARY OF THE INVENTION

It is therefore an object of the present invention to provide a chip feeder for chip mounter, which is capable of decreasing a size in the width direction.

For the above object, according to the present invention, there is provided an improved chip feeder, which includes: a tape feeding mechanism for feeding a carrier tape that further includes a rotating connection member for connecting the carrier tape, a first motor for driving the rotating connection member and a first transmission mechanism for transmitting drive power of the first motor to the rotating connection member, and a cover peeling mechanism for peeling a top cover tape from the carrier tape that further includes a peeling reel for winding the top cover tape, a second motor for driving the peeling reel and a second transmission mechanism for transmitting drive power of the second motor to the peeling reel. The first and second motors are outer rotor motors each of which includes a cylindrical stator fixed to a base at an axial center side having exciter coils and pole pieces magnetized by the exciter coils, and a cylindrical rotor arranged around the stator with a predetermined gap, and the first and second transmission mechanisms are engaged with outer surfaces of the rotors.

With this construction, the first and second motors are outer rotor motors, which allows the reduction of the thickness of the motor portions, decreasing the width of the chip feeder.

The rotating connection member may comprise a sprocket that connects sprocket holes formed on the carrier tape.

Each of the rotors may include a cylindrical permanent magnet whose pole varies along the circumferential direction and a back yoke fixed around the permanent magnet. In such a case, the first and second transmission mechanisms engage the outer surfaces of the back yokes.

The second transmission mechanism preferably includes at least three orbital rollers that externally contact the rotor of the second motor, a pulley that externally contacts the orbital rollers and rotates around an coaxial axis with the rotor, and at least three holding rollers that externally contact the pulley and are rotatably supported by the base. In such a case, the second transmission mechanism transmits rotation of the pulley to the peeling reel.

The peeling reel may form a single-piece construction with the pulley or the peeling reel may be linked with the pulley through a reduction mechanism. The reduction mechanism includes, for example, a first internal gear formed on an internal surface of an extending portion of the pulley extended in an axial direction, at least three small-diameter idle gears that are rotatably supported by the base to engage with the first internal gear, a center gear that engages with the idle gears to be rotated around the coaxial axis with the rotor, a sun gear that forms a single-piece construction with the center gear while keeping a predetermined distance from the center gear in the axial direction, a second internal gear formed on an internal surface of a cylindrical member fixed to the base with being coaxial with the rotor, at least three planetary gears that externally connect to the sun gear and are inscribed in the second internal gear, a rotation drum that holds rotation axes of the planetary gears to be rotated around the coaxial rotation axis with the rotor. The peeling reel forms a single-piece construction with the rotation drum.

Further, the holding rollers may be pressure rollers to apply centripetal force to the pulley.

Still further, the peeling reel may consists of a first collar member that includes a cylinder portion to wind the top cover tape and one collar, and a second collar member that includes a cylinder portion to wind the top cover tape and the other collar. In such a case, the first collar member is engaged with the second transmission mechanism and the second collar member is connected with the first collar member.

This construction expands applicability of the peeling reel to various top cover tapes having different width by exchanging the second collar member.

When the top cover tape exceeds the applicable range of the above described peeling reel, a center axis member is fixed to the base to be coaxial with the rotor of the second motor, and a closed-end cylindrical supporting member is mounted on the center axis member. The supporting member has a bottom portion that is rotatably connected to the center axis member at the closed-end side, and the open-end side thereof is engaged with the cylinder portion of the first collar member. In such a case, the second collar member is fitted around the first collar member and the supporting member that are engaged to each other.

The presence of the supporting member stabilizes the winding operation of the peeling reel even if the width of the top cover tape is extremely large. If the supporting member is not applied, the peeling reel becomes a cantilever, which causes instability in the winding operation.

The cylinder portions of the first collar member and the supporting member may have rectangular coupling teethes on the open-ends thereof. In such a case, the first collar member and the supporting member are engaged due to connection of the rectangular coupling teethes.

The width of the peeling reel can be adjusted without exchanging the collar member. For this purpose, rectangular coupling teethes can be formed on the open-ends of the cylinder portions of the first and second collar members. The first and second collar members can be engaged due to connection of the rectangular coupling teethes.

The rectangular coupling teeth of one of the first and second collar members may have a projection that is projected in the circumferential direction, and the rectangular coupling teeth of the other of the first and second collar members may have a plurality of pits in which the projection snaps. It is preferable that the pits are aligned in the axial direction with a predetermined distance in accordance with a standardized width of the top cover tape.

In general, the chip feeder is provided with an initial position sensor for detecting an initial position of the feeder to inform the chip supply timing to the chip mounter. The first transmission mechanism may include a backlash rejecting pressure gear in a gear train between a detected gear that is a target of the initial position sensor and a driven gear that drives the rotating connection member. The rotation axis of the pressure gear is movable in its perpendicular direction and the rotation axis is pressured by a spring such that the pressure gear pushes the gear in the gear train at the detected gear side and the gear in the gear train at the driven gear side.

Further, at the initial setting, it is necessary to add the pressure to the pressure gear under the condition where the detected gear and the rotating connection member are fixed to initial positions, respectively. Thus, the detected gear and the rotating connection member preferably have pin insertion holes at off-center positions and the base preferably has pin holding holes to hold tip-ends of pins passing through the pin insertion holes.

DESCRIPTION OF THE ACCOMPANYING DRAWINGS

FIG. 1A is a generic side view showing a mechanism of a chip feeder for a chip mounter according to an embodiment of the present invention;

FIG. 1B is an enlarged sectional view of FIG. 1A showing a detected gear portion;

DESCRIPTION OF THE EMBODIMENTS

An chip feeder for a chip mounter according to an embodiment of the present invention will be described with reference to the drawings.

Figure 2:
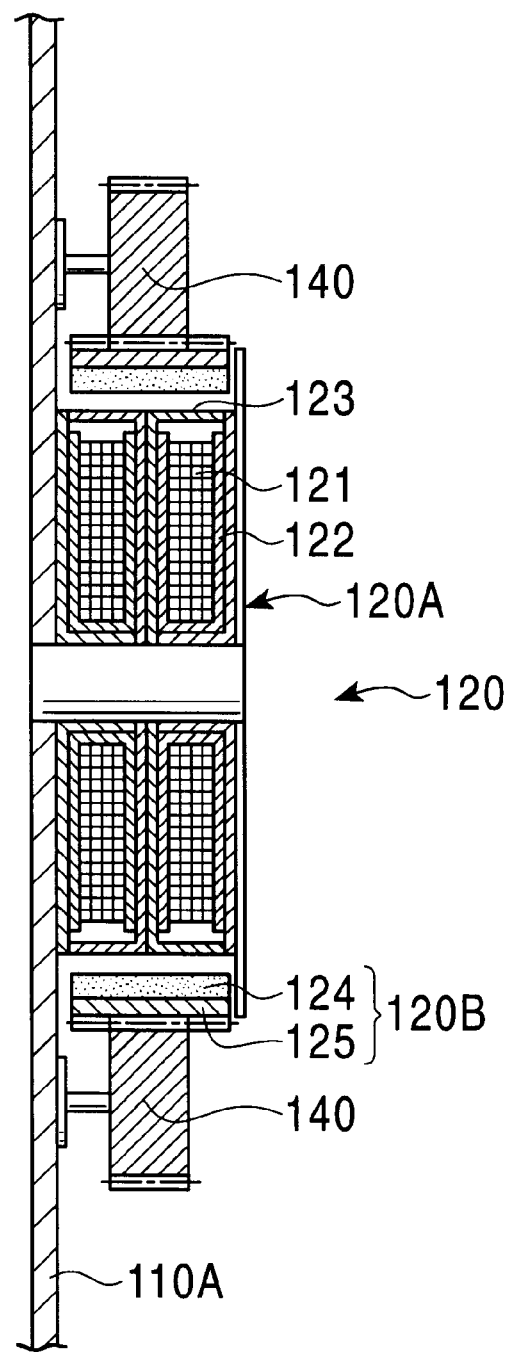
FIG. 2 is a sectional view of a motor of a tape feeding mechanism shown in FIG. 1A.
Figure 3:
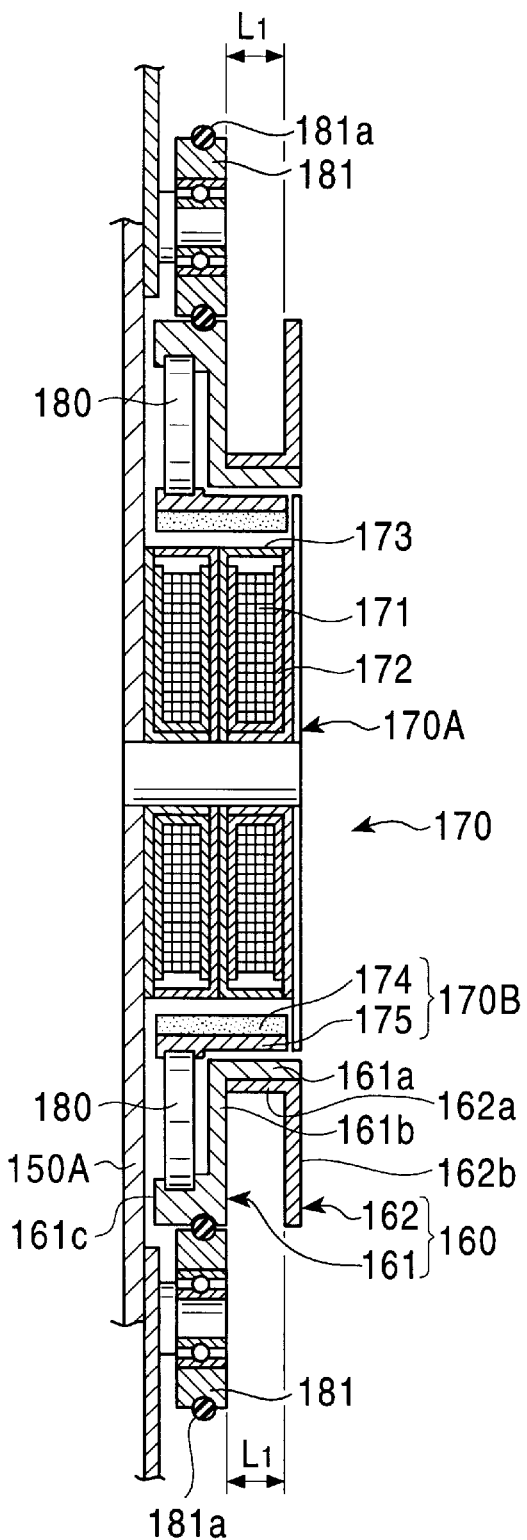
FIG. 3 is a sectional view of a cover peeling mechanism shown in FIG. 1A.
Figure 4:
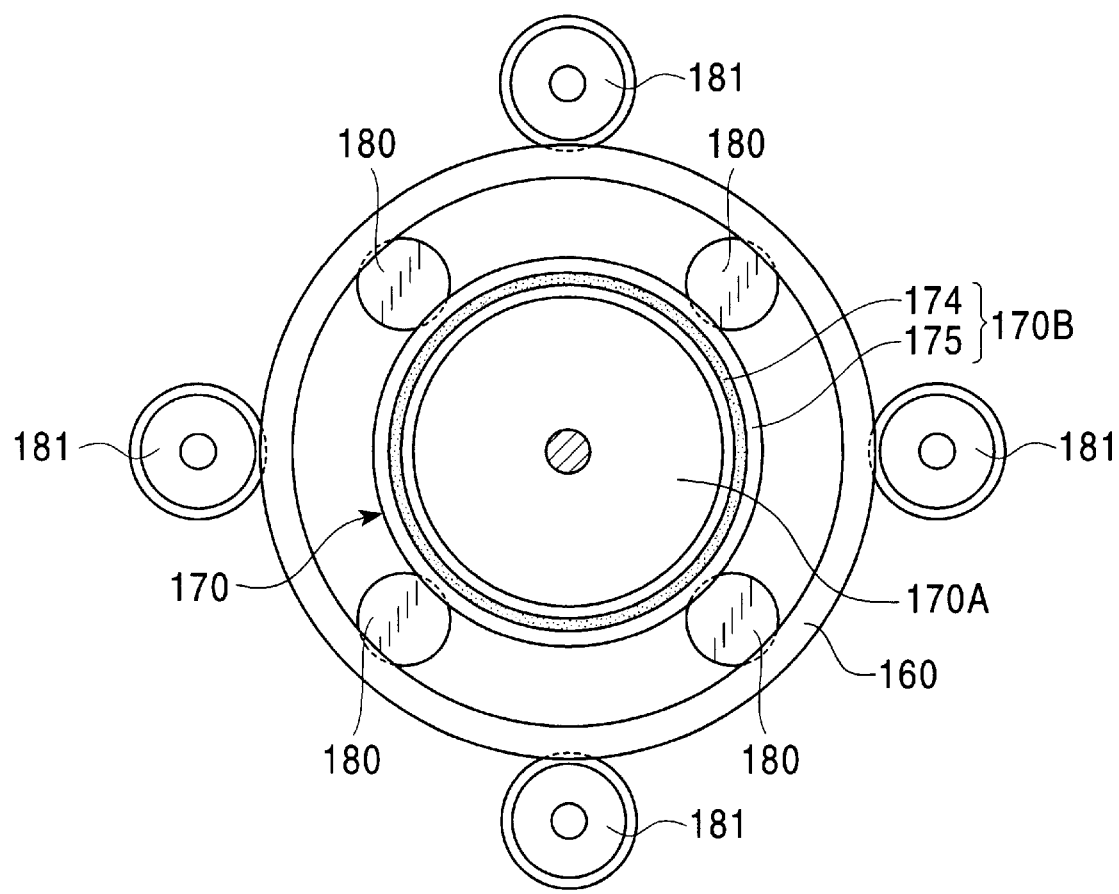
FIG. 4 is an enlarged side view of the cover peeling mechanism shown in FIG. 1A.

FIG. 1A is a generic side view showing a mechanism of the chip feeder, FIG. 1B is an enlarged sectional view of FIG. 1A showing a detected gear portion, FIG. 2 is a sectional view of a motor of a tape feeding mechanism shown in FIG. 1A, FIG. 3 is a sectional view of a cover peeling mechanism shown in FIG. 1A, and FIG. 4 is an enlarged side view of the cover peeling mechanism shown in FIG. 1A.

Figure 17A:
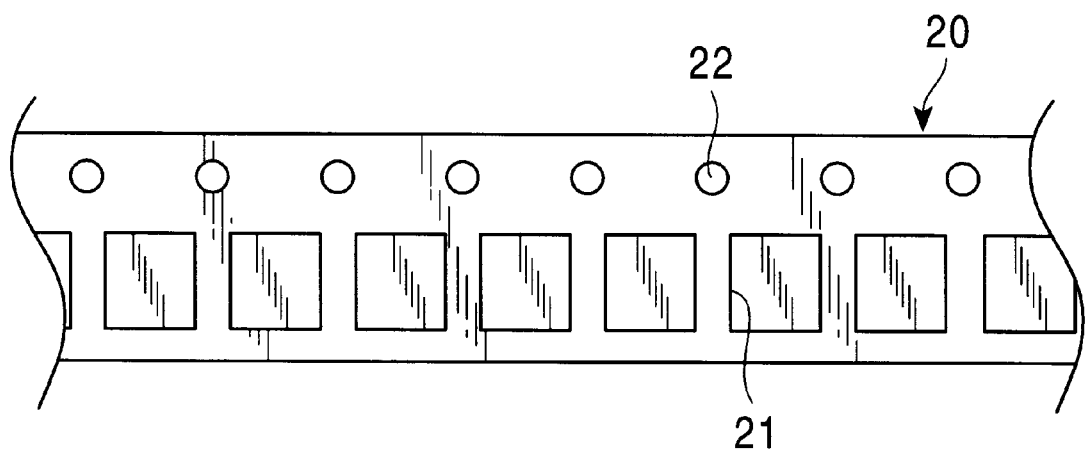
FIG. 17A is a plane view of the carrier tape.
Figure 17B:
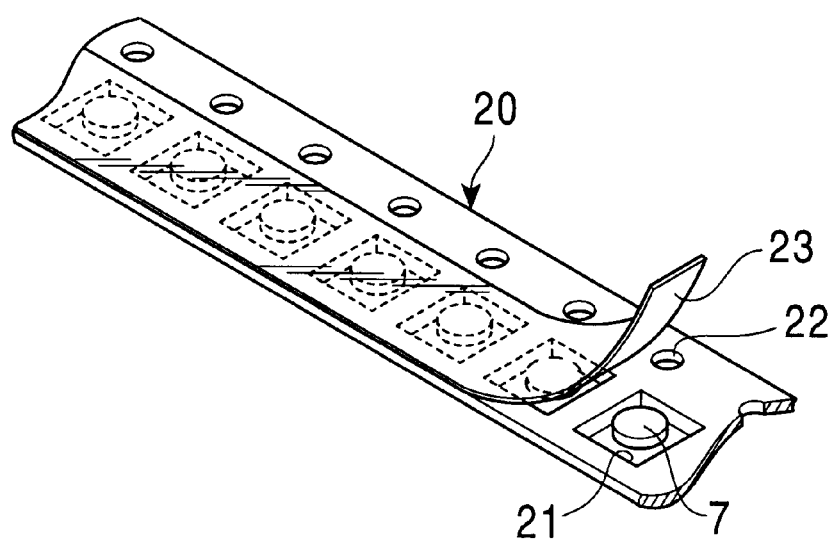
FIG. 17B is a perspective view of the carrier tape.
Figure 18:
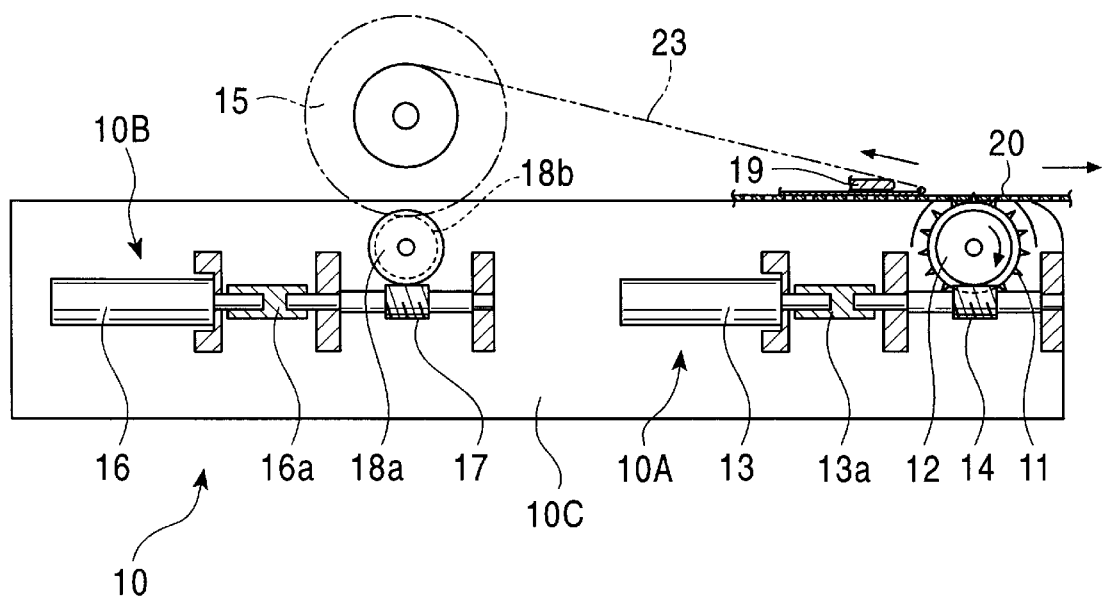
FIG. 18 is a side view showing a mechanism of a conventional chip feeder.

The chip feeder for the chip mounter of the embodiment supplies the electronic chips 7, which are packaged in the emboss portion 21 of the carrier tape 20 and sealed by the top cover tape 23 as shown in FIGS. 17A and 17B, to the chip mounter.

As shown in FIG. 1A, the chip feeder 100 of the embodiment includes a tape feeding mechanism 110 for feeding the carrier tape 20 and a cover peeling mechanism 150 for peeling the top cover tape 23 from the carrier tape 20.

The tape feeding mechanism 110 is provided with a sprocket 111 (a rotating connection member) for connecting the sprocket hole 22 of the carrier tape 20, a first motor 120 for driving the sprocket 111, and a gear train 130 for transmitting drive power of the first motor 120 to the sprocket 111. The gear train 130 constitutes a first transmission mechanism.

On the other hand, the cover peeling mechanism 150 includes a peeling reel 160 for peeling and winding the top cover tape 23, a second motor 170 for driving the peeling reel 160, and four orbital rollers 180 for transmitting the drive power of the second motor 170 to the peeling reel 160. The orbital rollers 180 constitute a second transmission mechanism. A peeling piece 151 is fixed to a base 150A of the chip feeder at the upstream from the sprocket 111 along the transmission of the carrier tape 20 that is transferred in the rightward direction in FIG. 1A. The top cover tape 23 is folded back by the peeling piece 151 to be wound by the peeling reel 160.

The first motor 120 is a spindleless outer rotor motor whose rotor 120B is supported by four holding gears 140. The holding gears 140 are rotatably attached to the base 110A around the rotor 120B with equal angular pitch. The outer gear formed around the rotor 120B meshes with the holding gears 140 and the gear train 130.

The gear train 130 includes first and second gears 131a and 131b that are coaxially fixed, third and fourth gears 132a and 132b that are coaxially fixed, fifth and sixth gears 133a and 133b that are coaxially fixed, a backlash rejecting pressure gear 134 and a driven gear 135 that is coaxially fixed to and drives the sprocket 111.

When the first motor 120 of the tape feeding mechanism 110 is driven, the rotor 120B rotates and the drive power is transmitted through the gear train 130 to the sprocket 111. As a result, the sprocket 111 rotates in the clockwise direction in FIG. 1A, which transfers the carrier tape 20 in the rightward direction in the drawing.

The fifth gear 133a is a detected gear that is a target of an initial position sensor 115. As shown in FIG. 1B, an arm 114 is projected from the base 110A, and the initial position sensor 115 is attached to the arm 114 such that the sensor 115 faces the fifth gear 133a. The initial position sensor 115 is, for example, a Hall effect device that outputs the initial position signal when the magnet attached to the fifth gear 133a comes to the sensor position. The detected initial position signal is transferred to the chip mounter to inform the chip supply timing.

The rotation axis 134a of the pressure gear 134 is movable in its perpendicular direction and the rotation axis 134a is pressured by a tensile spring 136 such that the pressure gear 134 pushes the sixth gear 133b that is coaxially fixed to the detected gear (the fifth gear 133a) and the driven gear 135 that is coaxially fixed to the sprocket 111.

The initial position signal must accurately indicate the rotation position of the sprocket 111 that actually feeds the carrier tape 20. However, the initial position sensor 115 is not always mounted at directly near position to the sprocket 111 due to mechanical reason. Thus, the initial position sensor 115 is mounted so as to detect the rotation position of the fifth gear 133a, and the backlash rejecting pressure gear 134 intervenes between the sprocket 111 and the fifth gear 133a in the chip feeder 100 of the embodiment.

With this construction, the backlash between the sprocket 111 and the fifth gear 133a is removed, which allows accurate determination of the rotation position of the sprocket 111 even if the initial position sensor 115 detects the rotation position of the fifth gear 133a.

Further, at the initial setting, it is necessary to add the pressure to the pressure gear 134 under the condition where the fifth gear 133a (the detected gear) and the sprocket 111 are fixed to initial positions, respectively. Thus, the fifth gear 133a and the sprocket 111 have a pair of pin insertion holes 133c and 133c, 111a and 111a at off-center positions, respectively. The base 110A has pin holding holes to hold tip-ends of pins passing through the pin insertion holes 133c and 111a. FIG. 1B shows the pin holding hole 112 that holds the pin 113 passing through the pin insertion hole 133c. In the same manner, the base 110A has a pin holding hole for the pin passing through the pin insertion hole 111a. At the initial setting, the pressure gear 134 is released from the connection to the gear train 130. After that, the fifth gear 133a is adjusted such that one of the pin insertion holes 133c is coincident with the pin holding hole 112, and then the pin 113 is inserted to fix the fifth gear 133a to the base 110A. In the same manner, the sprocket 111 is fixed to the base 110A. The fixed positions of the fifth gear 133a and the sprocket 111 by the pins are the initial positions. The pressure gear 134 is connected to the fixed condition, and then the pins 112 are removed.

The detail constructions of the fist and second motors 120 and 170 are described hereinafter. Both of the first and second motors 120 and 170 are outer rotor type blushless motors whose rotors are not supported by spindles (center axes). With this construction, the first and second motors 120 and 170 are the outer rotor motors, which allows the reduction of the thickness of the motor portions, decreasing the width of the chip feeder 100.

The first motor 120 in the tape feeding mechanism 110 is, as shown in FIG. 2, provided with a cylindrical stator 120A fixed to the base 110A at an axial center side and the cylindrical rotor 120B arranged around the stator 120A with a predetermined gap. The stator 120A includes exciter coils 121 that are wound around bobbins 122 and pole pieces 123 magnetized by the exciter coils 121. A plurality of exciter coils 121 are arranged along the circumferential direction with the predetermined gap.

The rotor 120B includes a cylindrical permanent magnet 124 whose pole varies along the circumferential direction, and a back yoke 125 fixed around the permanent magnet 124. An outer gear is formed around the back yoke 125 and the outer gear is connected to the holding gears 140 arranged around the rotor 120B.

The second motor 170 of the cover peeling mechanism 150 consists of, as shown in FIGS. 3 and 4, a stator 170A fixed to the base 150A and a rotor 170B arranged around the stator 170A with a predetermined gap. The stator 170A includes exciter coils 171 wound around bobbins 172 and pole pieces 173 in the same manner as the stator 120A. The rotor 170B includes a permanent magnet 174 and a back yoke 175.

Next, the second transmission mechanism to transfer a drive power of the second motor 170 to the peeling reel 160 will be described. The second transmission mechanism includes four orbital rollers 180 that externally contact the rotor 170B of the second motor 170 and a pulley that externally contacts the orbital rollers 180. The peeling reel rotates as the pulley rotates. The peeling reel 160 also serves as the pulley in this embodiment. Namely, the peeling reel 160 forms a single-piece construction with the pulley.

The peeling reel 160 consists of a first collar member 161 that includes a cylinder portion 161$a$ to wind the top cover tape 23 and one collar 161$b$, and a second collar member 162 that includes a cylinder portion 162$a$ to wind the top cover tape 23 and the other collar 162$b$. The cylinder portion 162$a$ of the second collar member 162 is fitted around the cylinder portion 161$a$ of the first collar member 161, which constitutes the peeling reel to wind the top cover tape whose width is $L_1$. A pulley portion 161$c$, which externally contacts the orbital rollers 180, is formed around the collar 161$b$ of the first collar member 161.

Furthermore, the peeling reel 160 is held by four holding rollers 181 that externally contact the pulley portion 161$c$ of the peeling reel 160. The holding rollers 181 are rotatably supported by the base 150A.

When the rotor 170B of the second motor 170 rotates, the orbital rollers 180 revolve both on their own axes and around the rotor 170B. As a result, the orbital rollers 180 rotate the peeling reel 160 on the coaxial axis with the roller 170B, which peels the top cover tape 23 from the carrier tape 20 to be wound.

Elastic rings 181$a$ are attached around the holding roller 181. The elastic rings 181$a$ apply pressure to the pulley portion 161$c$ to put a load on the rotation of the peeling reel 160. That is, the holding rollers 181 are formed as pressure rollers to apply centripetal force to the pulley portion 161$c$. Adjustment of the pressure applied by the elastic rings 181$a$ changes drive torque of the peeling reel 160, sliding friction between the rotor 170B and the peeling reel 160 in accordance with a chip size to be fed, or the like.

Six variations of the cover peeling mechanism 150 in the above embodiment will be described hereinafter.

Figure 5:
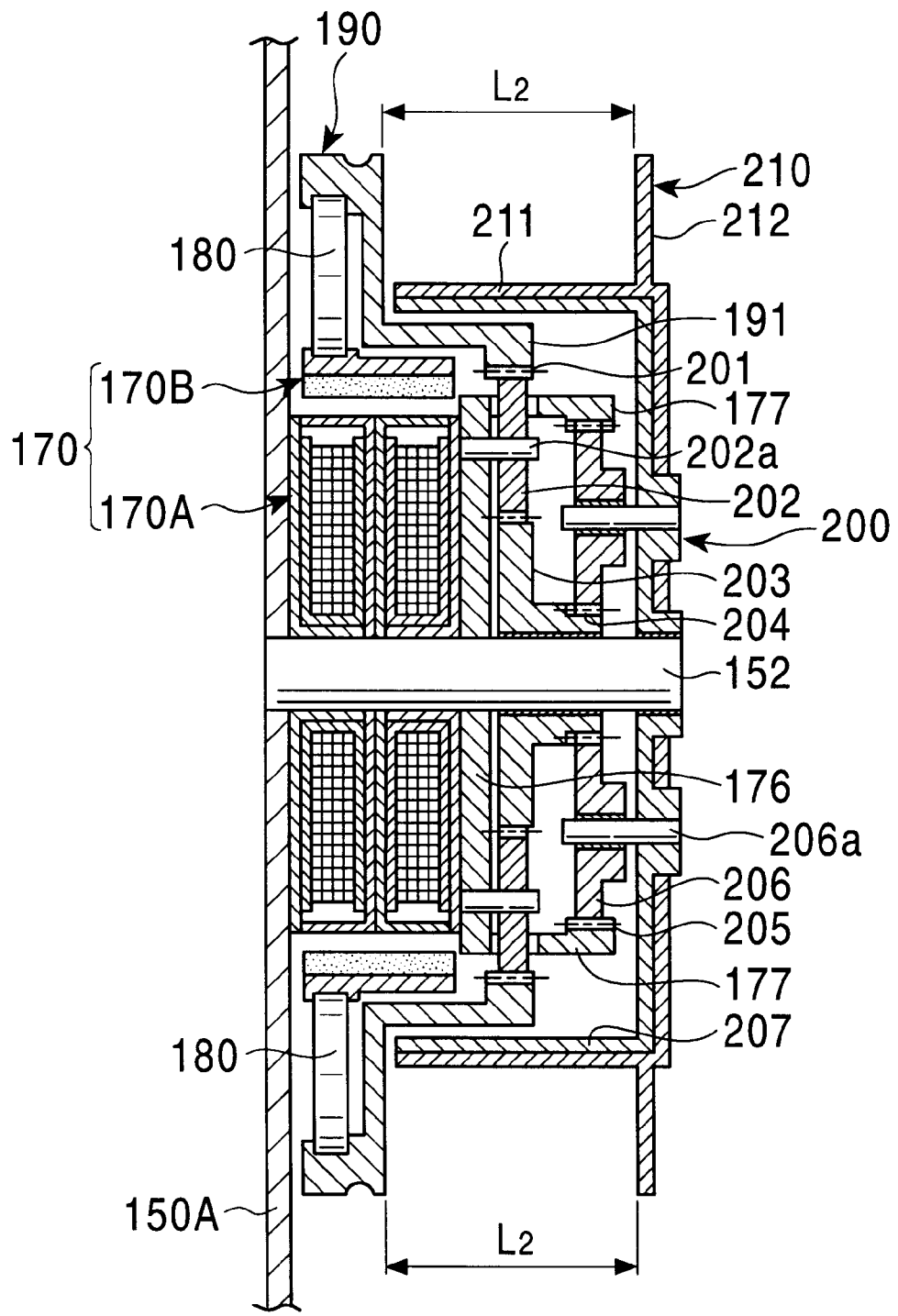
FIG. 5 is a sectional view of a first variation of the cover peeling mechanism.

FIG. 5 is a sectional view of a first variation of the cover peeling mechanism 150. The first variation aims to peel the top cover tape whose width is $L_2$ being wider than $L_1$. The wider top cover tape requires the larger rotation torque to peel and wind. Therefore, the cover peeling mechanism of FIG. 5 is provided with a reduction mechanism 200 between the pulley driven by the orbital rollers 180 and the peeling reel.

Thus, the cover peeling mechanism of FIG. 5 includes the second motor 170, the orbital rollers 180, a pulley 190, the reduction mechanism 200 and a peeling reel 210. Since the construction of the second motor 170 to drive the peeling reel 210 is identical to the embodiment of FIG. 3, the description is omitted.

The pulley 190 externally contacts the orbital rollers 180 and is held by the holding rollers 181 as with FIG. 3. The pulley 190 is provided with an extending portion 191 in the axial direction. A plane backing plate 176 is fixed to the stator 170A such that the plate 176 becomes parallel to the base 150A, and a stationary drum (a cylindrical member) 177 is fixed to the backing plate 176. Further, a center axis member 152 is fixed to the base 150A to be coaxial with the rotation center of the rotor 170B.

The reduction mechanism 200 includes a first internal gear 201 formed on an internal surface of the extending portion 191, four small-diameter idle gears 202 that are rotatably supported by rotation axes 202$a$ fixed to the backing plate 176 to engage with the first internal gear 201, a center gear 203 that is rotatably supported by the center axis member 152 and engages with the idle gears 202, a sun gear 204 that forms a single-piece construction with the center gear 202 while keeping a predetermined distance from the center gear 202 in the axial direction, a second internal gear 205 formed on an internal surface of the stationary drum 177, four planetary gears 206 that externally connect to the sun gear 204 and internally connect to the second internal gear 205, and a rotation drum 207 that holds rotation axes 206$a$ of the planetary gears 206 to be rotated around the coaxial rotation axis with the rotor 170B.

The peeling reel 210 is arranged to cover the rotation drum 207 from rightward direction in FIG. 5. The peeling reel 210 consists of a cylinder portion 211 to wind the top cover tape 23 and one collar 212. The side surface of the pulley 190 constitutes the other collar in the first variation.

When the rotor 170B of the second motor 170 rotates, the orbital rollers 180 revolve both on their own axes and around the rotor 170B. As a result, the orbital rollers 180 rotate the pulley 190 on the coaxial axis with the roller 170B, which rotates the idle gears 202. The rotation of the idle gears 202 is transferred to the center gear 203 that internally connects the idle gears 202, then the center gear 203 and the sun gear 204 rotate around the center axis member 152. Since the planetary gears 206 are engaged with the second internal gear 205 of the stationary drum 177, the planetary gears 206 revolve both on their own axes and around the sun gear 204 as the sun gear 204 rotates. As a result, the rotation drum 207, which holds the rotation axis 206$a$ of the planetary gears 206, rotates around the center axis member 152 together with the peeling reel 210, which peels the top cover tape 23 from the carrier tape 20 to be wound.

Figure 6:
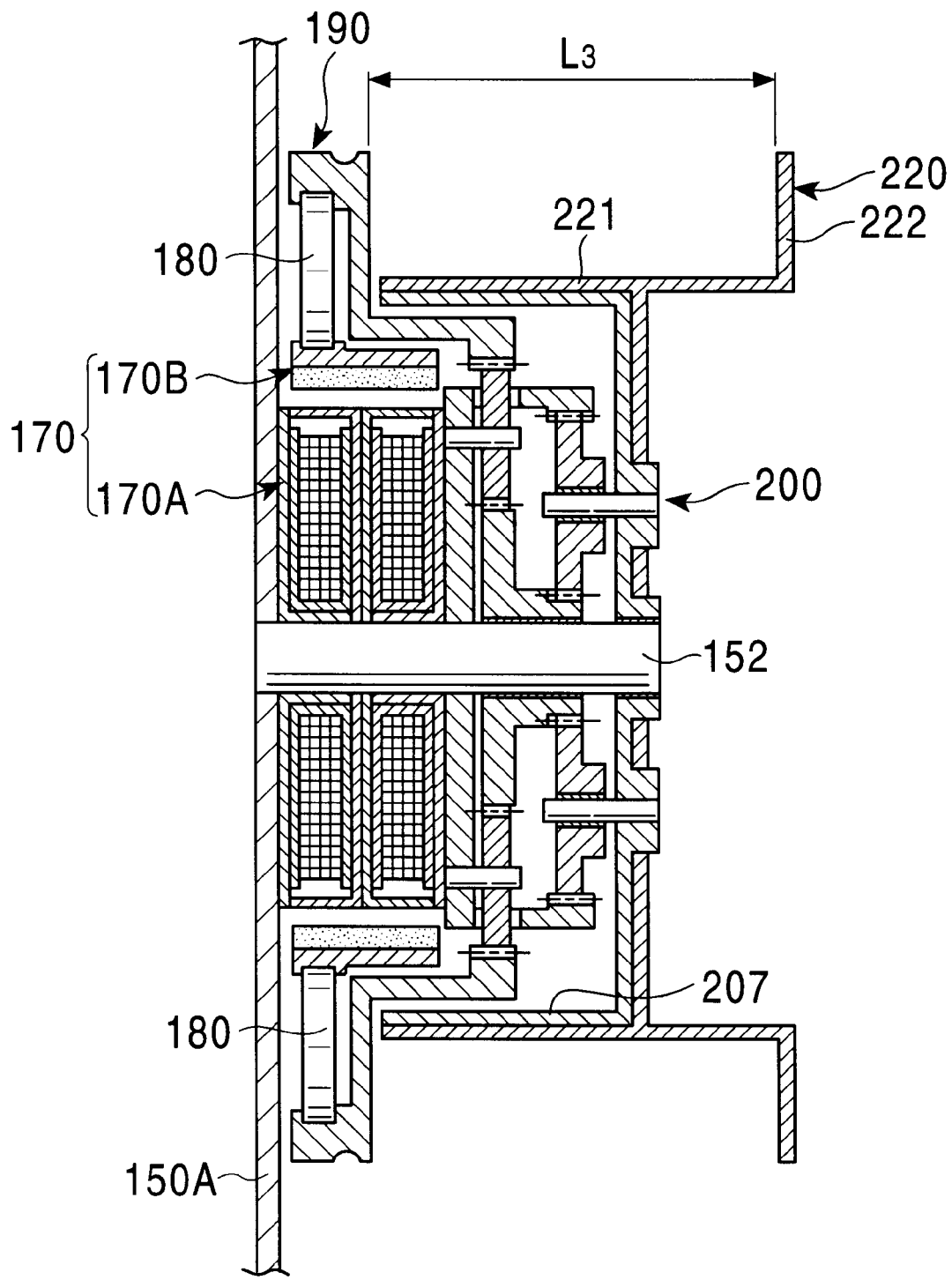
FIG. 6 is a sectional view of a second variation of the cover peeling mechanism.

FIG. 6 is a sectional view of a second variation of the cover peeling mechanism 150. The second variation aims to peel the top cover tape whose width is $L_3$ being wider than $L_2$.

The cover peeling mechanism of FIG. 6 includes the second motor 170, the orbital rollers 180, the pulley 190, the reduction mechanism 200 and a peeling reel 220. Since the constructions of the second motor 170, the orbital rollers 180, the pulley 190 and the reduction mechanism 200 are identical to the first variation shown in FIG. 5, the descriptions are omitted.

The peeling reel 220 is arranged to cover the rotation drum 207 from rightward direction in FIG. 6. The peeling reel 220 consists of a cylinder portion 221 to wind the top cover tape 23 and one collar 222. The side surface of the pulley 190 constitutes the other collar in the second variation. Namely, the cover peeling mechanism of the second variation can be constructed by replacing the peeling reel 210 of the first variation with the peeling reel 220.

The operation of the second variation is identical to the first variation. The drive power of the second motor 170 is transferred to the peeling reel 220 through the second transmission mechanism including the orbital rollers 180, the pulley 190 and the reduction mechanism 200. Therefore, the peeling reel 220 peels the top cover tape 23 from the carrier tape 20 and winds it.

Figure 7:
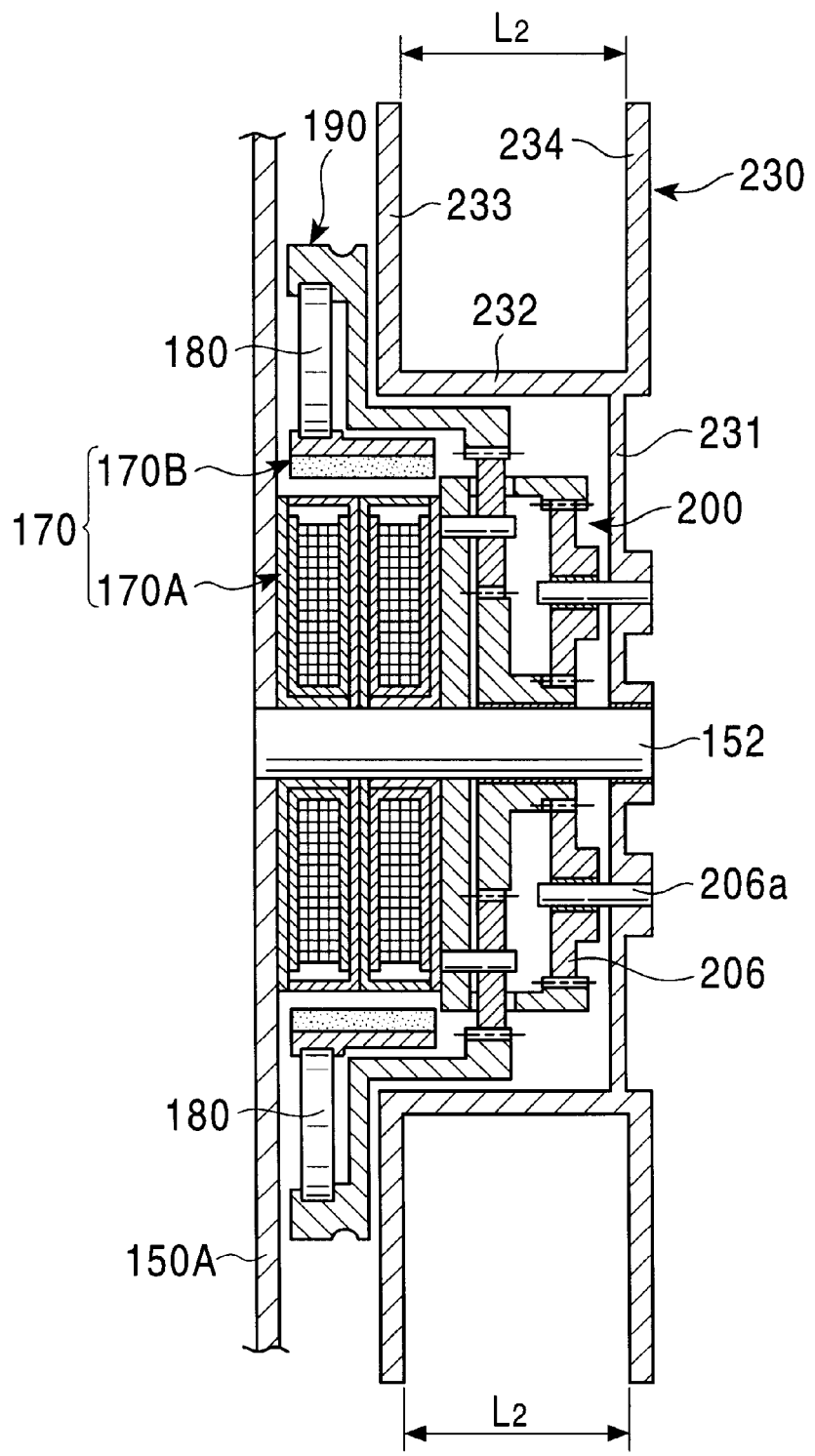
FIG. 7 is a sectional view of a third variation of the cover peeling mechanism.

FIG. 7 is a sectional view of a third variation of the cover peeling mechanism 150. The third variation aims to peel the top cover tape whose width is $L_2$ as with the first variation.

The cover peeling mechanism of FIG. 7 includes the second motor 170, the orbital rollers 180, the pulley 190, the reduction mechanism 200 and a peeling reel 230. The constructions of the second motor 170, the orbital rollers 180, the pulley 190 and the reduction mechanism 200 are identical to the first variation shown in FIG. 5. However, the peeling reel 230 also serves as the rotation drum 207 of the first and second variations.

The peeling reel 230 consists of a disc portion 231 that is rotatably attached to the center axis member 152, a cylinder portion 232 that is formed around the disc portion 231 to wind the top cover tape 23, and a pair of collars 233 and 234 that are outwardly formed at axial ends of the cylinder portion 232. The disc portion 231 holds the rotation axes 206a of the planetary gears 206 of the reduction mechanism 200.

The operation of the third variation is identical to the first variation. The drive power of the second motor 170 is transferred to the peeling reel 230 through the second transmission mechanism including the orbital rollers 180, the pulley 190 and the reduction mechanism 200. Therefore, the peeling reel 230 peels the top cover tape 23 from the carrier tape 20 and winds it.

Figure 8:
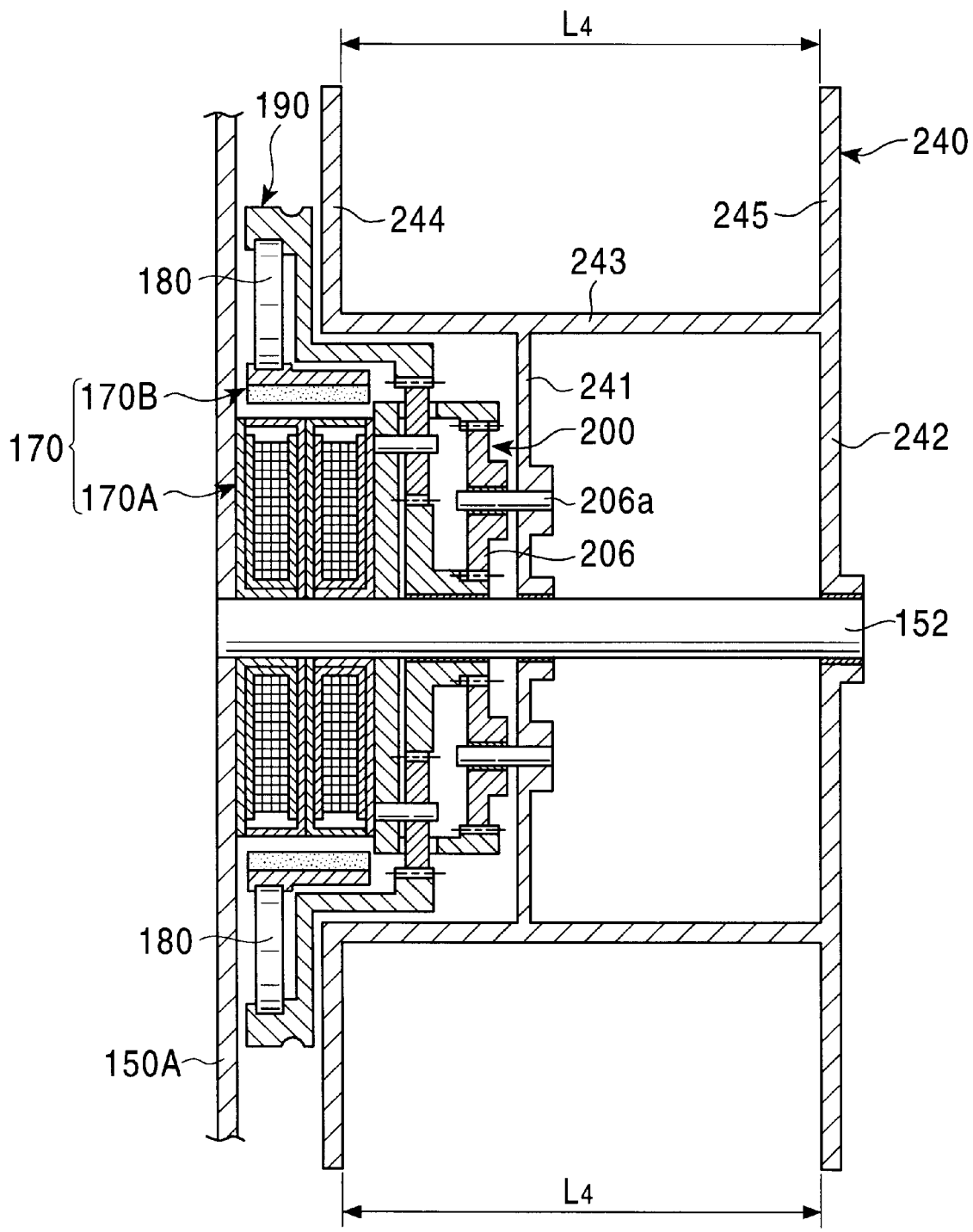
FIG. 8 is a sectional view of a fourth variation of the cover peeling mechanism.

FIG. 8 is a sectional view of a fourth variation of the cover peeling mechanism 150. The fourth variation aims to peel the top cover tape whose width is $L_4$ being wider than $L_3$.

The cover peeling mechanism of FIG. 8 includes the second motor 170, the orbital rollers 180, the pulley 190, the reduction mechanism 200 and a peeling reel 240. The constructions of the second motor 170, the orbital rollers 180, the pulley 190 and the reduction mechanism 200 are identical to the third variation shown in FIG. 7

The peeling reel 240 consists of first and second disc portions 241 and 242 that are rotatably attached to the center axis member 152 with the predetermined distance therebetween, a cylinder portion 243 that is formed around the disc portions 241 and 242 to wind the top cover tape 23, and a pair of collars 244 and 245 that are outwardly formed at axial ends of the cylinder portion 243. The first disc portion 241 holds the rotation axes 206a of the planetary gears 206 of the reduction mechanism 200.

When the peeling reel becomes a cantilever to respond the wider top cover tape 23, the winding operation tends to become unstable. The double disc construction of the fourth variation is able to stabilize the winding operation.

The operation of the fourth variation is identical to the first variation. The drive power of the second motor 170 is transferred to the peeling reel 240 through the second transmission mechanism including the orbital rollers 180, the pulley 190 and the reduction mechanism 200. Therefore, the peeling reel 240 peels the top cover tape 23 from the carrier tape 20 and winds it.

Figure 9:
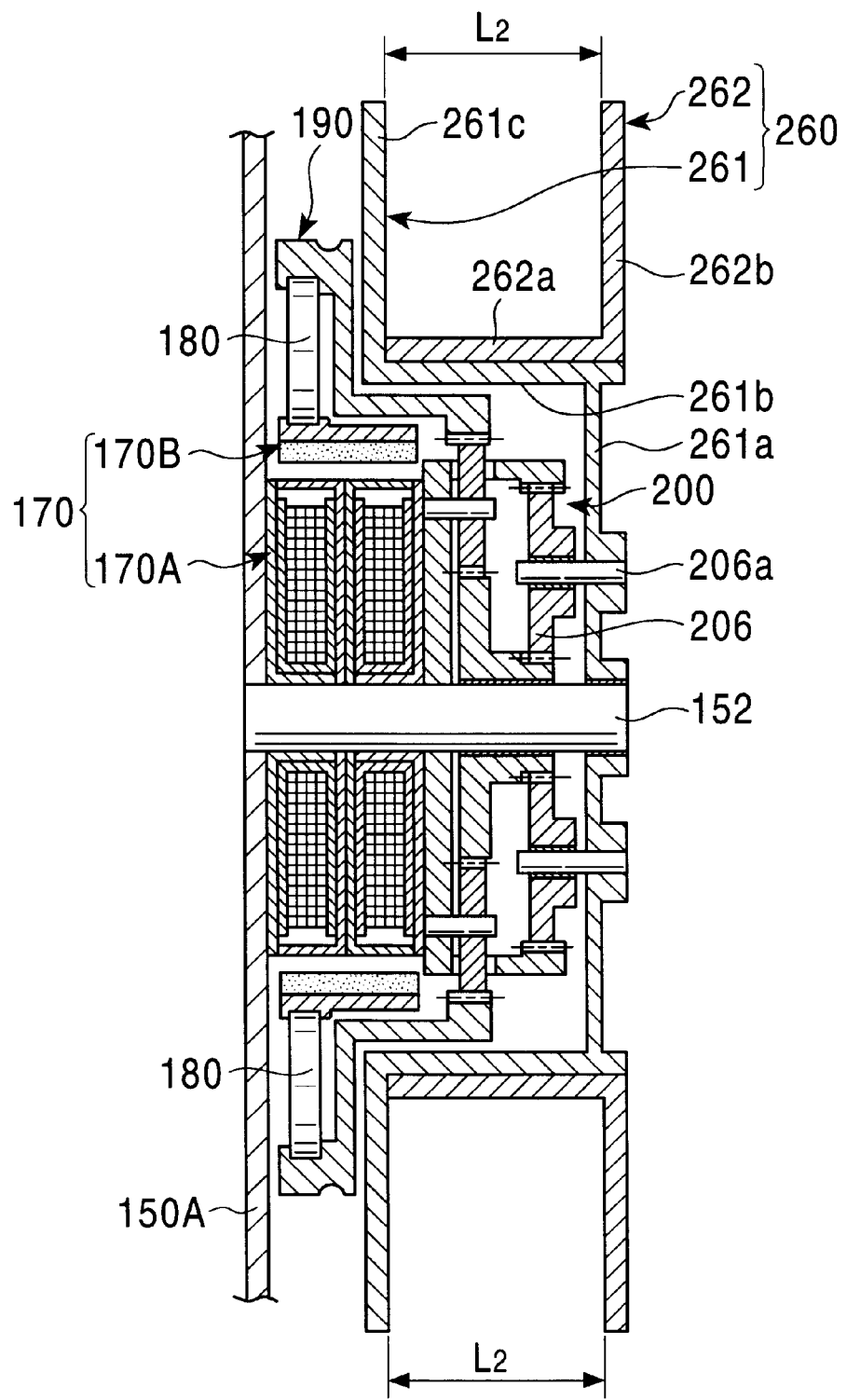
FIG. 9 is a sectional view of a fifth variation of the cover peeling mechanism.

FIG. 9 is a sectional view of a fifth variation of the cover peeling mechanism 150. The fifth variation aims to peel the top cover tape whose width is $L_2$ as with the first variation.

The cover peeling mechanism of FIG. 9 includes the second motor 170, the orbital rollers 180, the pulley 190, the reduction mechanism 200 and a peeling reel 260. The constructions of the second motor 170, the orbital rollers 180, the pulley 190 and the reduction mechanism 200 are identical to the third variation shown in FIG. 7.

The peeling reel 260 consists of first and second collar member 261 and 262 that are formed as separate parts. The first collar member 261 includes a disc portion 261a that is rotatably connected to the center axis member 152, a cylinder portion 261b that is formed around the disc portion 261a to wind the top cover tape 23, and one collar 261c that is outwardly formed at one axial end of the cylinder portion 261b. The disc portion 261a holds the rotation axes 206a of the planetary gears 206 of the reduction mechanism 200. On the other hand, the second collar member 262 includes a cylinder portion 262a to wind the top cover tape 23 and the other collar 262b. Since the cylinder portion 262a of the second collar member 262 is fitted around the cylinder portion 261b of the first collar member 261, the second collar member 262 is fixed to the first collar member 261.

This construction expands applicability of the peeling reel to various top cover tapes 23 having different width by exchanging the second collar member 262.

The operation of the fifth variation is identical to the first variation. The drive power of the second motor 170 is transferred to the peeling reel 260 through the second transmission mechanism including the orbital rollers 180, the pulley 190 and the reduction mechanism 200. Therefore, the peeling reel 260 peels the top cover tape 23 from the carrier tape 20 and winds it.

Figure 10:
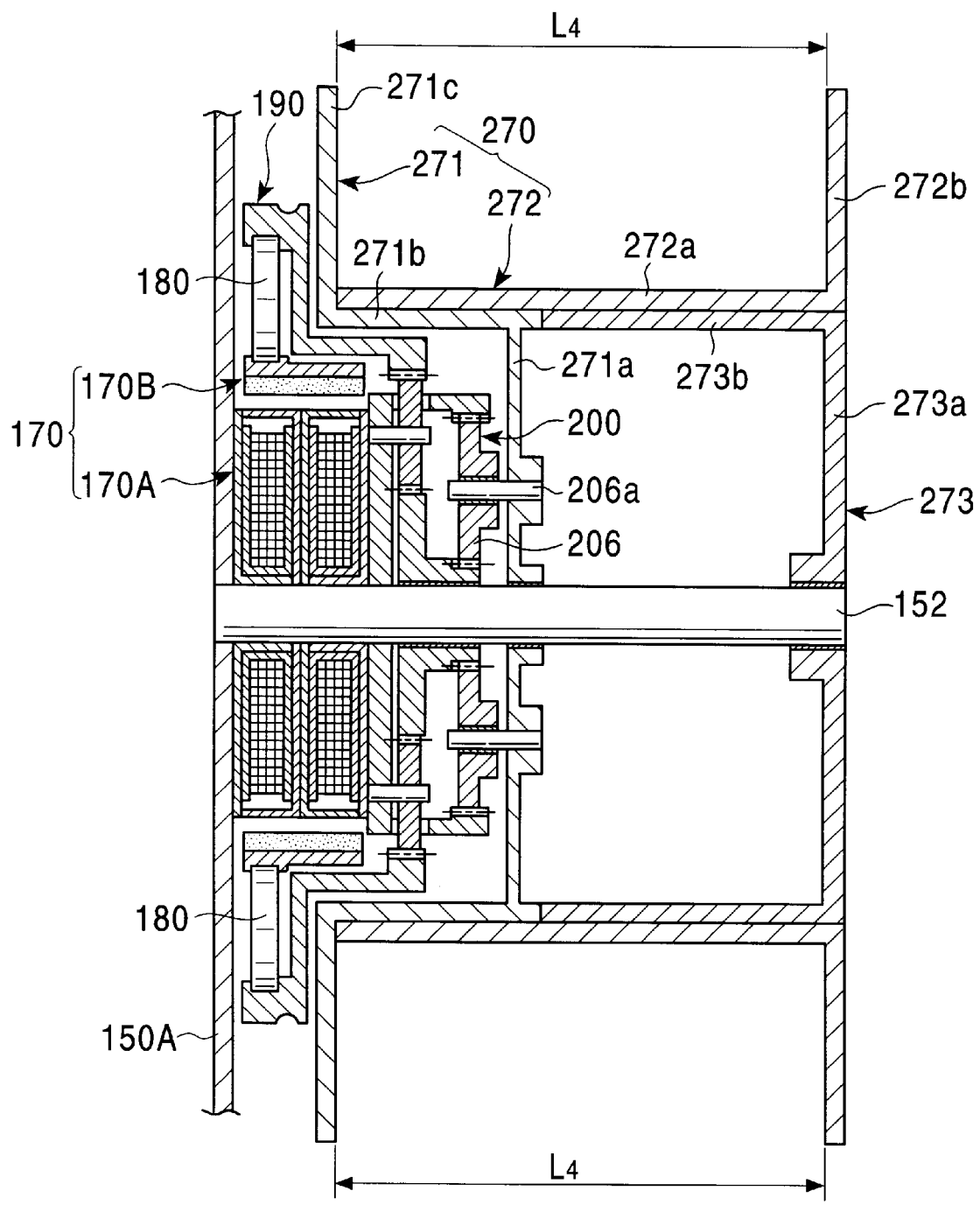
FIG. 10 is a sectional view of a sixth variation of the cover peeling mechanism.

FIG. 10 is a sectional view of a sixth variation of the cover peeling mechanism 150. The sixth variation aims to peel the top cover tape whose width is $L_4$ as with the fourth variation.

The cover peeling mechanism of FIG. 10 includes the second motor 170, the orbital rollers 180, the pulley 190, the reduction mechanism 200 and a peeling reel 270. The constructions of the second motor 170, the orbital rollers 180, the pulley 190 and the reduction mechanism 200 are identical to the third variation shown in FIG. 7.

The peeling reel 270 consists of first and second collar members 271, 272 and a closed-end cylindrical supporting member 273 that are formed as separate parts. The first collar member 271 includes a disc portion 271a that is rotatably connected to the center axis member 152, a cylinder portion 271b that is formed around the disc portion 271a to wind the top cover tape 23, and one collar 271c that is outwardly formed at one axial end of the cylinder portion 271b. The disc portion 271a holds the rotation axes 206a of the planetary gears 206 of the reduction mechanism 200. On the other hand, the second collar member 272 includes a cylinder portion 272a to wind the top cover tape 23 and the other collar 272b. The supporting member 273 has a disc portion 273a that is rotatably connected to the center axis member 152 and a cylinder portion 273b that is formed around the disc portion 273a.

Figure 11:
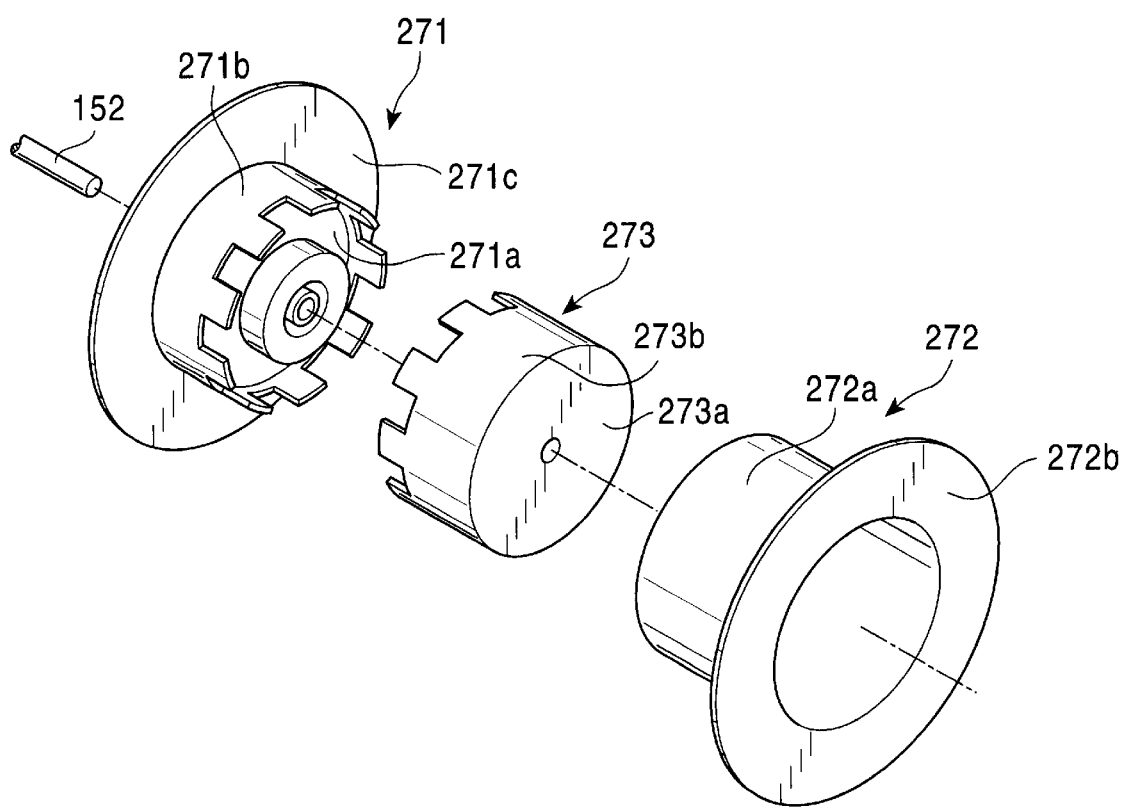
FIG. 11 is an exploded perspective view of first and second collar members and a supporting member of FIG. 10.

FIG. 11 is an exploded perspective view of the first and second collar members 271, 272 and the supporting member 273. The first collar member 271 has rectangular coupling teethes at the open-end of the cylinder portion 271b. The coupling teethes consist of convex portions and concave portions that are alternatively arranged along the circumferential direction. In the same manner, the supporting member 273 has coupling teethes at the open-end of the cylinder portion 273b. The first collar member 271 and the supporting member 273 are engaged to each other due to connection of the rectangular coupling teethes. Since the diameter of the cylinder portion 271b of the first collar member 271 is equal to the diameter of the cylinder portion 273b of the supporting member 273, a wide cylinder portion is formed by connecting the first collar member 271 with the supporting member 273. The cylinder portion 272b of the second collar member 272 is fitted around the connected cylinder portions 271b and 273b.

The presence of the supporting member 273 stabilizes the winding operation of the peeling reel 270 even if the width of the top cover tape 23 is extremely large. If the supporting member 273 is not applied, the peeling reel 270 becomes a cantilever, which causes instability in the winding operation.

The operation of the sixth variation is identical to the first variation. The drive power of the second motor 170 is transferred to the peeling reel 270 through the second transmission mechanism including the orbital rollers 180, the pulley 190 and the reduction mechanism 200. Therefore, the peeling reel 270 peels the top cover tape 23 from the carrier tape 20 and winds it.

It should be noted that the cover peeling mechanism of the fifth variation shown in FIG. 9 can be modified to the cover peeling mechanism of the sixth variation shown in FIG. 10 according to the following steps.

At a first step, the second collar member 262(width $L_2$) is removed from the peeling reel 260 of the fifth variation. At a second step, the supporting member 273 is connected to the first collar member 261(271). At a final step, the second collar member 272(width $L_4$) is attached to the first collar member 271 and the supporting member 273.

This construction expands applicability of the peeling reel to various top cover tapes having different width by only exchanging the second collar member 262(272) and the supporting member 273 that have relatively simple constructions, while keeping the mechanism including the first collar member 261(271) as a common component.

Figure 12:
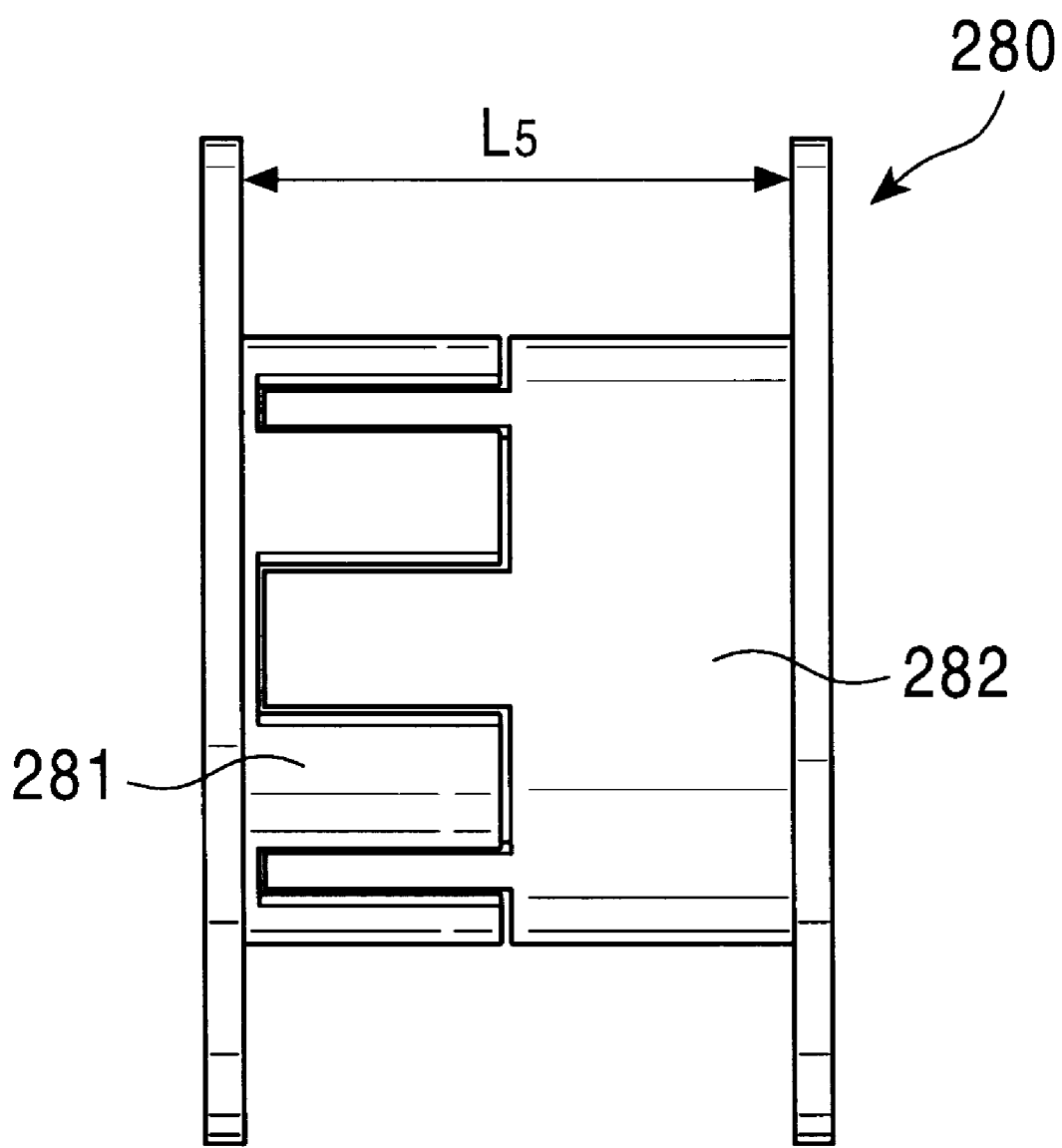
FIG. 12 is a side view of a variation of the peeling reel.

The width of the peeling reel can be adjusted without exchanging the collar member. FIG. 12 is a side view of a variation of the peeling reel whose width is adjustable.

Figure 13:
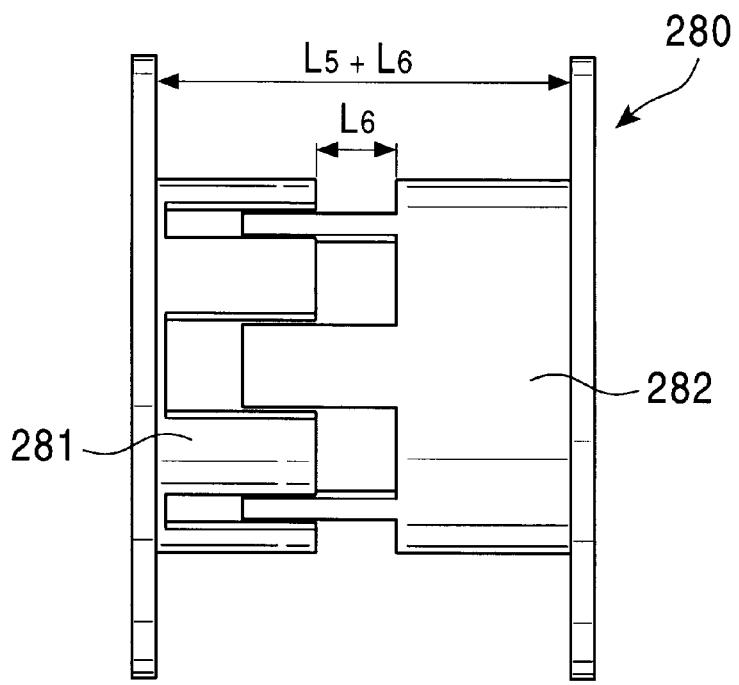
FIG. 13 is a side view of the peeling reel of FIG. 12 when the reel width becomes large.

The peeling reel 280 consists of first and second collar member 281 and 282. Each of the collar member 281 and 282 has a cylinder portion and a collar. The first collar member 281 has rectangular coupling teethes at the open-end of the cylinder portion. In the same manner, the second collar member 282 has coupling teethes at the open-end of the cylinder portion. The first and second collar members 281 and 282 are engaged to each other due to connection of the rectangular coupling teethes. Further, the relative slide movement of the collar members 281 and 282 changes degree of the coupling connection, which changes the width between the collars. FIG. 12 shows the condition at the minimum width $L_5$. FIG. 13 shows the condition when the collar members 281 and 282 are adjusted to add width $L_6$ to be suitable for the top cover tape 23 whose width is ($L_5+L_6$).

Figure 14:
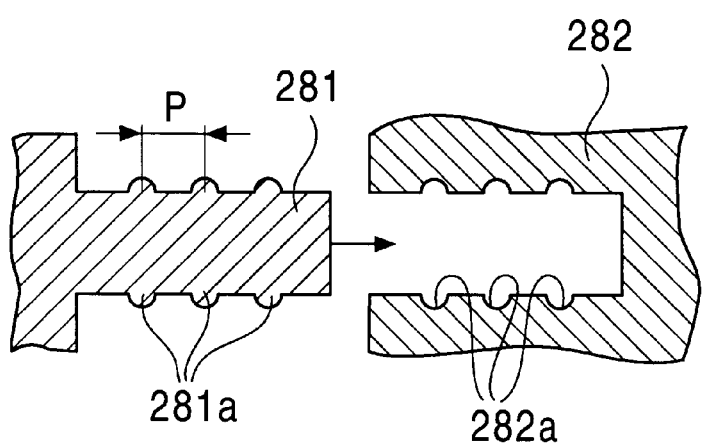
FIG. 14 is a sectional view showing the main portion of a variation of the peeling reel of FIG. 12.

FIG. 14 is a sectional view showing the main portion of a variation of the peeling reel 280 shown in FIG. 12. In the variation of FIG. 14, the rectangular coupling teeth of the first collar member 281 has a plurality of projections 281a that are projected in the circumferential direction, and the rectangular coupling teeth of the second collar member 282 has a plurality of pits in which the projections 281a snap. The projections 281a and the pits 282a are aligned in the axial direction with a predetermined distance P in accordance with a standardized width of the top cover tape 23.

The projections 281a and the pits 282a are formed on the teethes in two places that are separated in 180 degree in the circumferential direction. Since the collar member is made from resin that has predetermined elasticity, the projections 281a repeat to snap on and release from the pits 282a with predetermined click feeling when the collar members 281 and 282 are relatively moved along the axis direction.

With this construction, the width of the peeling reel 280 can be easily determined in accordance with the standardized width of the top cover tape 23.

Finally, a variation of the tape feeding mechanism 110 shown in FIG. 1A will be described.

Figure 15:
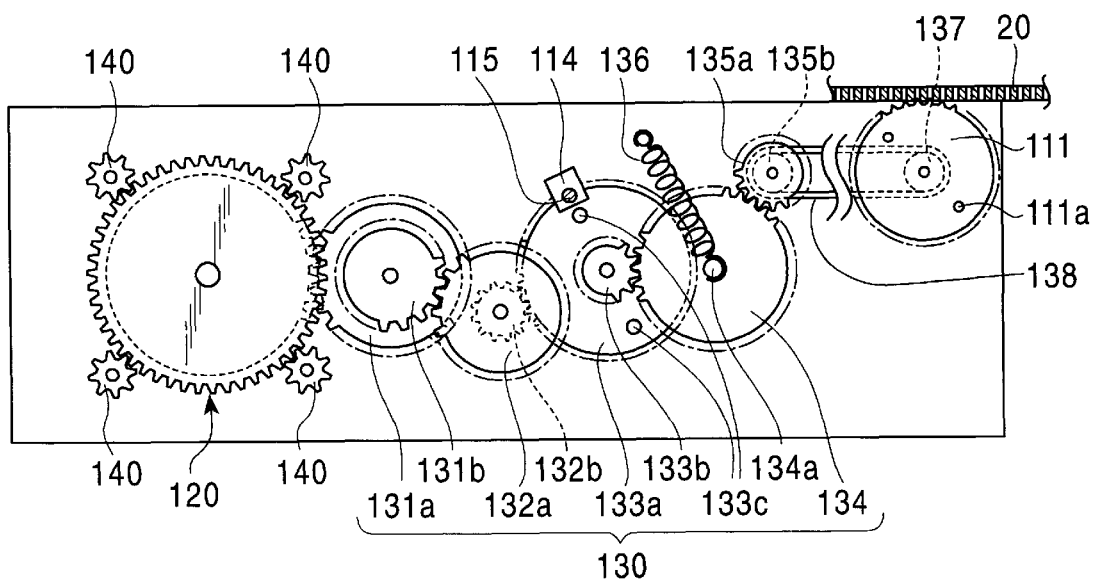
FIG. 15 is a side view of a variation of the tape feeding mechanism.
Figure 16:
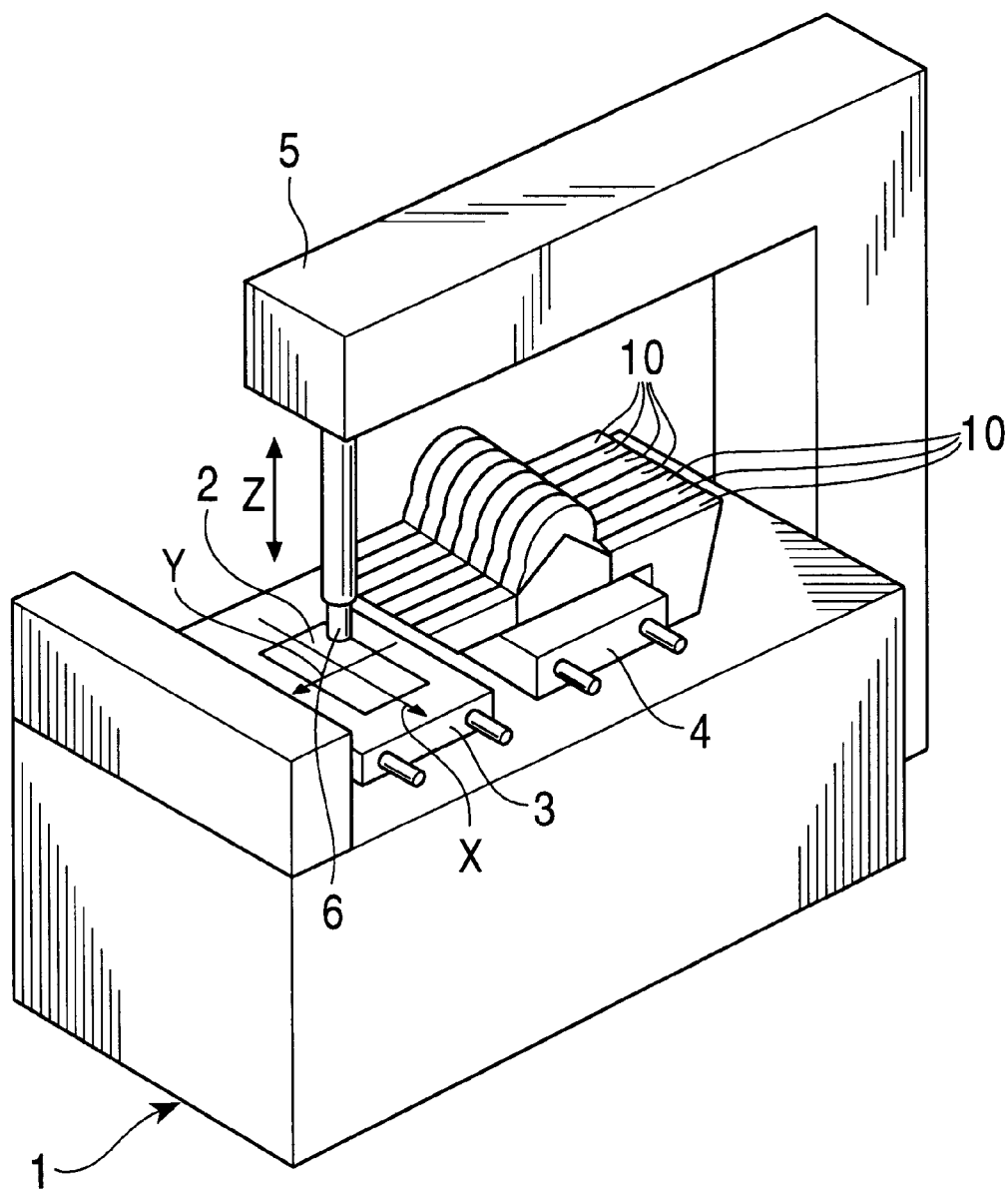
FIG. 16 is a perspective view of the chip mounter.

The tape feeding mechanism of FIG. 15 is provided with a sprocket 111 (a rotating connection member) for connecting the sprocket hole 22 of the carrier tape 20, the first motor 120 for driving the sprocket 111, and a first transmission mechanism for transmitting a drive power of the first motor 120 to the sprocket 111.

The first transmission mechanism includes a gear train 130 and a belt mechanism. The gear train 130 includes first and second gears 131a and 131b that are coaxially fixed, third and fourth gears 132a and 132b that are coaxially fixed, fifth and sixth gears 133a and 133b that are coaxially fixed, a backlash rejecting pressure gear 134 and a driven gear 135a. The belt mechanism includes a drive pulley 135b that is coaxially fixed to the driven gear 135a, a driven pulley 137 that is coaxially fixed to the sprocket 111 and a belt 138 that loops over the pulleys 135b and 137.

The first motor 120 and the gear train 130 are identical to the constructions of the embodiment shown in FIG. 1A. The backlash rejecting pressure gear 134 that is pressured by the tensile spring 136 engages with the fifth gear 133a that is detected by the initial position sensor 115 and the driven gear 135a that is fixed to the drive pulley 135b of the belt mechanism to drive the sprocket 111.

Since the belt mechanism is free from backlash, the rotation of the driven gear 135a is accurately transmitted to the sprocket 111. And the backlash between the driven gear 135a and the fifth gear 133a is removed by the pressure gear 134. Therefore, the rotation position of the sprocket 111 is accurately detected even if the initial position sensor 115 detects the rotation position of the fifth gear 133a.

According to the present invention, since the first and second motors are outer rotor motors, which allows the reduction of the thickness of the motor portions, decreasing the width of the chip feeder.

Further, when the peeling pulley is constructed from the first and second collar members, applicability of the peeling reel can be expanded to various top cover tapes having different width by exchanging the second collar member.

Still further, when the backlash rejecting pressure gear is mounted on the gear train in the tape feeding mechanism, the initial position of the rotating connection member that feeds the carrier tape can be accurately detected even if the initial position sensor detects the rotation position of the different gear in the gear train.

What is claimed is:

1. A chip feeder for supplying electronic chips that are held in emboss portions of a carrier tape whose top openings are sealed by a top cover tape to a chip mounter, said chip feeder comprising:

a tape feeding mechanism for feeding said carrier tape, said feeding mechanism including a rotating connection member for connecting said carrier tape, a first motor for driving said rotating connection member and a first transmission mechanism for transmitting drive power of said first motor to said rotating connection member; and a cover peeling mechanism for peeling said top cover tape from said carrier tape, said cover peeling mechanism including a peeling reel for winding said top cover tape, a second motor for driving said peeling reel and a second transmission mechanism for transmitting drive power of said second motor to said peeling reel, wherein said first and second motors are outer rotor motors each of which includes a cylindrical stator fixed to a base at an axial center side having exciter coils and pole pieces magnetized by said exciter coils, and a cylindrical rotor arranged around said stator with a predetermined gap, and wherein said first and second transmission mechanisms are engaged with outer surfaces of said rotors.

2. The chip feeder for the chip mounter according to claim 1, wherein said rotating connection member comprises a sprocket that connects sprocket holes formed on said carrier tape.

3. The chip feeder for the chip mounter according to claim 1, wherein each of said rotors includes a cylindrical permanent magnet whose pole varies along the circumferential direction and a back yoke fixed around said permanent magnet, and wherein said first and second transmission mechanisms engage the outer surfaces of said back yokes.

4. The chip feeder for the chip mounter according to claim 1, wherein said second transmission mechanism includes at least three orbital rollers that externally contact said rotor of said second motor, a pulley that externally contacts said orbital rollers and rotates around an coaxial axis with said rotor, and at least three holding rollers that externally contact said pulley and are rotatably supported by said base, and wherein said second transmission mechanism transmits rotation of said pulley to said peeling reel.

5. The chip feeder for the chip mounter according to claim 4, wherein said peeling reel forms a single-piece construction with said pulley.

6. The chip feeder for the chip mounter according to claim 4, wherein said peeling reel is linked with said pulley through a reduction mechanism.

7. The chip feeder for the chip mounter according to claim 6, wherein said reduction mechanism comprises a first internal gear formed on an internal surface of an extending portion of said pulley extended in an axial direction, at least three small-diameter idle gears that are rotatably supported by said base to engage with said first internal gear, a center gear that engages with said idle gears to be rotated around the coaxial axis with said rotor, a sun gear that forms a single-piece construction with said center gear while keeping a predetermined distance from said center gear in the axial direction, a second internal gear formed on an internal surface of a cylindrical member fixed to said base with being coaxial with said rotor, at least three planetary gears that externally connect to said sun gear and are inscribed in said second internal gear, a rotation drum that holds rotation axes of said planetary gears to be rotated around the coaxial rotation axis with said rotor; and wherein said peeling reel forms a single-piece construction with said rotation drum.

8. The chip feeder for the chip mounter according to claim 4, wherein said holding rollers are pressure rollers to apply centripetal force to said pulley.

9. The chip feeder for the chip mounter according to claim 1, wherein said peeling reel comprises a first collar member that includes a cylinder portion to wind said top cover tape and one collar, and a second collar member that includes a cylinder portion to wind said top cover tape and the other collar, and wherein said first collar member is engaged with said second transmission mechanism and said second collar member is connected to said first collar member.

10. The chip feeder for the chip mounter according to claim 9, wherein said cylinder portion of said second collar member is fitted around said cylinder portion of said first collar member.

11. The chip feeder for the chip mounter according to claim 9, further comprising a center axis member fixed to said base to be coaxial with the rotor of said second motor, and a closed-end cylindrical supporting member whose bottom portion at the closed-end side is rotatably connected to said center axis member and the open-end side thereof is engaged with said cylinder portion of said first collar member, and wherein said second collar member is fitted around said first collar member and said supporting member that are engaged to each other.

12. The chip feeder for the chip mounter according to claim 11, wherein said cylinder portions of said first collar member and said supporting member have rectangular coupling teethes on the open-ends thereof, and said first collar member and said supporting member are engaged due to connection of said rectangular coupling teethes.

13. The chip feeder for the chip mounter according to claim 9, wherein said cylinder portions of said first and second collar members have rectangular coupling teethes on the open-ends thereof, and said first and second collar members are engaged due to connection of said rectangular coupling teethes.

14. The chip feeder for the chip mounter according to claim 13, wherein said rectangular coupling teeth of one of said first and second collar members has a projection that is projected in the circumferential direction, and wherein said rectangular coupling teeth of the other of said first and second collar members has a plurality of pits in which said projection snaps, said pits being aligned in the axial direction with a predetermined distance in accordance with a standardized width of said top cover tape.

15. The chip feeder for the chip mounter according to claim 1, wherein said first transmission mechanism includes a backlash rejecting pressure gear in a gear train between a detected gear that is a target of an initial position sensor and a driven gear that drives said rotating connection member, and wherein the rotation axis of said pressure gear is movable in its perpendicular direction and said rotation axis is pressured by a spring such that said pressure gear pushes the gear in said gear train at said detected gear side and the gear in said gear train at said driven gear side.

16. The chip feeder for the chip mounter according to claim 15, wherein said pressure gear is engaged with the gear that is coaxially fixed to said detected gear and the gear that is coaxially fixed to said rotating connection member.

17. The chip feeder for the chip mounter according to claim 15, wherein said pressure gear is engaged with the gear that is coaxially fixed to said detected gear and the gear that is coaxially fixed to a pulley over which a belt to drive said rotating connection member is looped.

18. The chip feeder for the chip mounter according to claim 15, wherein said detected gear and said rotating connection member have pin insertion holes at off-center positions and said base has pin holding holes to hold tip-ends of pins passing through said pin insertion holes.

19. A chip feeder for supplying electronic chips that are held in emboss portions of a carrier tape whose top openings are sealed by a top cover tape to a chip mounter, said chip feeder comprising:

a tape feeding mechanism for feeding said carrier tape; and a cover peeling mechanism for peeling said top cover tape from said carrier tape, said cover peeling mechanism including a peeling reel for winding said top cover tape, a motor for driving said peeling reel and a transmission mechanism for transmitting drive power of said motor to said peeling reel, wherein said motor is outer rotor motor that includes a cylindrical stator fixed to a base at an axial center side having exciter coils and pole pieces magnetized by said exciter coils, and a cylindrical rotor arranged around said stator with a predetermined gap, and wherein said transmission mechanism includes at least three orbital rollers that externally contact said rotor of said motor, a pulley that externally contacts said orbital rollers and rotates around an coaxial axis with said rotor, and at least three holding rollers that externally contact said pulley and are rotatably supported by said base.

20. The chip feeder for the chip mounter according to claim 19, wherein said peeling reel forms a single-piece construction with said pulley.

21. The chip feeder for the chip mounter according to claim 19, wherein said peeling reel is linked with said pulley through a reduction mechanism.

* * * * *